(12) United States Patent
Fang et al.

(10) Patent No.: US 10,852,888 B2
(45) Date of Patent: Dec. 1, 2020

(54) METHOD AND APPARATUS FOR DETERMINING CONTROL PARAMETERS OF CANCELLATION BRANCH, AND TOUCH CONTROL DETECTION APPARATUS

(71) Applicant: SHENZHEN GOODIX TECHNOLOGY CO., LTD., Shenzhen (CN)

(72) Inventors: Jun Fang, Shenzhen (CN); Guanliang Liao, Shenzhen (CN); Yang Yang, Shenzhen (CN); Zhi Yao, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/421,477

(22) Filed: May 24, 2019

(65) Prior Publication Data

US 2019/0278424 A1   Sep. 12, 2019

Related U.S. Application Data

(63) Continuation of application No. PCT/CN2017/115935, filed on Dec. 13, 2017.

(51) Int. Cl.
*G06F 3/041*   (2006.01)
*G06F 3/044*   (2006.01)
*G01R 27/26*   (2006.01)

(52) U.S. Cl.
CPC ....... *G06F 3/0418* (2013.01); *G01R 27/2605* (2013.01); *G06F 3/044* (2013.01)

(58) Field of Classification Search
CPC .............. G06F 3/0418; G06F 3/04182; G06F 3/04186; G06F 3/044; G01R 27/2605; H03K 17/955; H03K 17/962
See application file for complete search history.

(56) References Cited

U.S. PATENT DOCUMENTS 8,321,174 B1 * 11/2012 Moyal ................... G06F 3/0416
                                                    702/150
9,389,256 B2 *  7/2016 Angelini ................. G06F 3/044
(Continued)

FOREIGN PATENT DOCUMENTS

CN      102955608 A       3/2013
CN      103376968 A      10/2013
(Continued)

*Primary Examiner* — Tom V Sheng

(57) ABSTRACT

A method and an apparatus for determining a control parameter of a cancellation branch, and a touch control detection apparatus are provided. The method includes: inputting a first constant signal to the cancellation branch, and inputting a first excitation signal to a self-capacitance detection branch, and performs differential processing for an output signal to obtain a first output signal; determining, based on the first output signal, a sum of phase delays; inputting a second constant signal to the self-capacitance detection branch, and inputting a second excitation signal to the cancellation branch, and performs differential processing for the output signal to obtain a second output signal; determining, based on the second output signal, a phase delay; and determining the control parameter of the cancellation branch based on the sum of phase delays and the phase delay.

20 Claims, 4 Drawing Sheets

(56) References Cited

U.S. PATENT DOCUMENTS

| | | | |
|---|---|---|---|
| 9,927,904 B2* | 3/2018 | Lee | G06F 3/0416 |
| 2011/0063154 A1 | 3/2011 | Hotelling et al. | |
| 2013/0285943 A1* | 10/2013 | Kuo | G06F 3/0412 |
| | | | 345/173 |
| 2013/0285976 A1* | 10/2013 | Kuo | G06F 3/044 |
| | | | 345/174 |
| 2014/0145997 A1 | 5/2014 | Tiruvuru | |
| 2014/0327644 A1 | 11/2014 | Mohindra | |
| 2015/0035787 A1* | 2/2015 | Shahparnia | G06F 3/044 |
| | | | 345/174 |
| 2015/0077386 A1* | 3/2015 | Huang | G06F 3/044 |
| | | | 345/174 |
| 2015/0227232 A1* | 8/2015 | Yao | G06F 3/044 |
| | | | 345/174 |
| 2016/0173089 A1* | 6/2016 | Kao | H03K 17/962 |
| | | | 200/600 |
| 2016/0357320 A1* | 12/2016 | Ito | G06F 1/3262 |
| 2017/0139539 A1* | 5/2017 | Yao | G06F 3/0416 |
| 2017/0364191 A1* | 12/2017 | Jiang | G01L 1/144 |
| 2017/0371003 A1* | 12/2017 | Kim | G01R 33/0206 |
| 2018/0081467 A1* | 3/2018 | Jiang | G06K 9/0002 |
| 2018/0121020 A1* | 5/2018 | Lee | G06F 3/0418 |
| 2018/0238944 A1* | 8/2018 | Yoo | G06F 3/0418 |
| 2018/0321788 A1* | 11/2018 | Kimura | G02F 1/13306 |
| 2019/0072597 A1* | 3/2019 | Walsh | G01R 27/2605 |
| 2019/0079609 A1* | 3/2019 | Jiang | G01R 27/2605 |
| 2019/0102004 A1* | 4/2019 | Krah | G06F 3/0416 |
| 2019/0171312 A1* | 6/2019 | Chen | H03F 3/45475 |
| 2019/0294297 A1* | 9/2019 | Sasai | G06F 3/04182 |

FOREIGN PATENT DOCUMENTS

| | | |
|---|---|---|
| CN | 103713784 A | 4/2014 |
| CN | 103914197 A | 7/2014 |
| CN | 104020914 A | 9/2014 |
| CN | 104049822 A | 9/2014 |
| CN | 106155435 A | 11/2016 |
| CN | 106257387 A | 12/2016 |
| CN | 107436703 A | 12/2017 |

* cited by examiner

METHOD AND APPARATUS FOR DETERMINING CONTROL PARAMETERS OF CANCELLATION BRANCH, AND TOUCH CONTROL DETECTION APPARATUS

CROSS REFERENCE TO RELATED APPLICATIONS

The present application is a continuation of international application No. PCT/CN2017/115935 filed on Dec. 13, 2017, which is hereby incorporated by reference in its entirety.

TECHNICAL FIELD

Embodiments of the present application relate to the technical field of electric circuits, and in particular, relate to a method and apparatus for determining control parameters of a cancellation branch, and a touch control detection apparatus.

BACKGROUND

The touch control technology, when applied to an electronic product such as a smart terminal, enables a user to operate the terminal only by means of gesture operations. As such, a traditional mechanical keyboard is not needed, such that man-machine interaction is simpler and more direct.

Since touch control may be practiced directly based on an impact caused by a human body to an electrical field, the capacitive touch control technology has become one of the mainstream means for practicing touch control on the electronic product. In the capacitive touch control technology, mutual-capacitive touch control and self-capacitive touch control are both involved. The self-capacitive touch control is extensively applied because the self-capacitive touch control achieves such effects as water-proof, interference resistance, and power consumption reduction. Therefore, most touch control systems are based on a combination of mutual-capacitance detection and self-capacitance detection.

In the self-capacitance detection, since a to-be-detected self-capacitor is formed by a detection channel and a system ground, a greater original reference value is generally present. Where touch control occurs, a capacitance of the to-be-detected self-capacitor has a small variation amount or variation rate, accuracy of touch control detection may be low, and user experience may be degraded.

SUMMARY

In view of the above, embodiments of the present application are intended to provide a method and apparatus for determining a control parameter of a cancellation circuit, and a touch control detection apparatus, to address or relieve the above technical defects in the related art.

Embodiments of the present application provide a method for determining a control parameter of a cancellation branch. The method includes:

inputting a first constant signal to the cancellation branch, and inputting a first excitation signal to a self-capacitance detection branch, where a rear-end processing circuit of the self-capacitance detection branch at least performs differential processing for an output signal of the cancellation branch and an output signal of the self-capacitance detection branch to obtain a first output signal;

determining, based on the first output signal, a sum of phase delays generated by the self-capacitance detection branch and the rear-end processing circuit of the self-capacitance detection branch in response to the first excitation signal;

inputting a second constant signal to the self-capacitance detection branch, and inputting a second excitation signal to the cancellation branch, where the rear-end processing circuit of the self-capacitance detection branch at least performs differential processing for the output signal of the cancellation branch and the output signal of the self-capacitance detection branch to obtain a second output signal;

determining, based on the second output signal, a phase delay generated by the rear-end processing circuit in response to the second excitation signal; and determining the control parameter of the cancellation branch based on the sum of phase delays and the phase delay generated by the rear-end processing circuit in response to the second excitation signal.

Optionally, in any one embodiment of the present application, the first constant signal is a first direct current bias signal, and/or the second constant signal is a second direct current bias signal.

Optionally, in any one embodiment of the present application, the first excitation signal and the second excitation signal have the same frequency and starting phase.

Optionally, in any one embodiment of the present application, the control parameter of the cancellation branch includes a resistance of an adjustable resistor and a capacitance of an adjustable capacitor; where the adjustable resistor and the adjustable capacitor are configured to cancel or reduce a resistance of a front-end RC network in the self-capacitance detection branch and an original reference value of a to-be-detected self-capacitor.

Optionally, in any one embodiment of the present application, an RC network in the cancellation branch is defined as a pure impedance network or an approximately pure impedance network during determining the phase delay generated by the rear-end processing circuit in response to the second excitation signal.

Optionally, in any one embodiment of the present application, the determining, based on the first output signal, a sum of phase delays generated by the self-capacitance detection branch and the rear-end processing circuit of the self-capacitance detection branch in response to the first excitation signal includes:

determining, based on an amplitude and a phase of the first output signal, the sum of phase delays generated by the self-capacitance detection branch and the rear-end processing circuit of the self-capacitance detection branch in response to the first excitation signal.

Optionally, in any one embodiment of the present application, the determining, based on the first output signal, a sum of phase delays generated by the self-capacitance detection branch and the rear-end processing circuit of the self-capacitance detection branch in response to the first excitation signal further includes:

performing demodulation and integration processing for the first output signal to obtain a first in-phase signal and a first quadrature signal; and determining the amplitude and the phase of the first output signal based on the first in-phase signal and the first quadrature signal.

Optionally, in any one embodiment of the present application, the determining, based on the second output signal, a phase delay generated by the rear-end processing circuit in response to the second excitation signal includes:

determining, based on an amplitude and a phase of the second output signal, the phase delay generated by the rear-end processing circuit in response to the second excitation signal.

Optionally, in any one embodiment of the present application, the determining, based on the second output signal, a phase delay generated by the rear-end processing circuit in response to the second excitation signal includes:

performing demodulation and integration processing for the second output signal to obtain a second in-phase signal and a second quadrature signal; and determining the amplitude and the phase of the second output signal based on the second in-phase signal and the second quadrature signal.

Optionally, in any one embodiment of the present application, the determining the control parameter of the cancellation branch based on the sum of phase delays and the phase delay generated by the rear-end processing circuit in response to the second excitation signal includes:

determining, based on the sum of phase delays and the phase delay generated by the rear-end processing circuit in response to the second excitation signal, the phase delay generated by the self-capacitance detection branch in response to the first excitation signal; and determining the control parameter of the cancellation branch based on the phase delay generated by the self-capacitance detection branch in response to the first excitation signal.

Optionally, in any one embodiment of the present application, the determining the control parameter of the cancellation branch based on the phase delay generated by the self-capacitance detection branch in response to the first excitation signal includes:

establishing an association relationship between a front-end RC network in the self-capacitance detection branch and an RC network in the cancellation branch based on the phase delay generated by the self-capacitance detection branch in response to the first excitation signal; and determining the control parameter of the cancellation branch based on the association relationship between the front-end RC network in the self-capacitance detection branch and the RC network in the cancellation branch.

Optionally, in any one embodiment of the present application, the control parameter of the cancellation branch includes a first control parameter and a second control parameter, and correspondingly, the determining the control parameter of the cancellation branch based on an association relationship between the front-end RC network in the self-capacitance detection branch and the RC network in the cancellation branch includes:

determining the second control parameter of the cancellation branch based on the association relationship between the front-end RC network in the self-capacitance detection branch and the RC network in the cancellation branch, and a predefined first control parameter of the cancellation branch.

Optionally, in any one embodiment of the present application, the rear-end processing circuit includes at least one of: an amplifier, a filter and an analog-to-digital converter; where the amplifier is configured to perform differential processing for the output signal of the self-capacitance detection branch and the output signal of the cancellation branch, the filter is configured to perform filtering processing for signals upon the differential processing, and the analog-to-digital converter is configured to perform analog-to-digital conversion for signals upon the filtering.

Embodiments of the present application further provide an apparatus for determining a control parameter of a cancellation branch. The apparatus includes: a first phase delay determining unit, a second phase delay determining unit and a control parameter determining unit; where when a first constant signal is input to the cancellation branch and a first excitation signal is input to a self-capacitance detection branch, a rear-end processing circuit of the self-capacitance detection branch at least performs differential processing for an output signal of the cancellation branch and an output signal of the self-capacitance detection branch to obtain a first output signal, the first phase delay determining unit is configured to determine, based on the first output signal, a sum of phase delays generated by the self-capacitance detection branch and the rear-end processing circuit of the self-capacitance detection branch in response to the first excitation signal;

when a second constant signal is input to the self-capacitance detection branch and a second excitation signal is input to the cancellation branch, the rear-end processing circuit of the self-capacitance detection branch at least performs differential processing for the output signal of the cancellation branch and the output signal of the self-capacitance detection branch to obtain a second output signal, and the second delay determining unit is configured to determine, based on the second output signal, a phase delay generated by the rear-end processing circuit in response to the second excitation signal; and the control parameter determining unit is configured to determine the control parameter of the cancellation branch based on the sum of phase delays and the phase delay generated by the rear-end processing circuit in response to the second excitation signal.

Embodiments of the present application further provide a touch control detection apparatus. The apparatus includes: a self-capacitance detection branch, a cancellation branch, a rear-end processing circuit, and the apparatus for determining a control parameter of a cancellation branch as described above; where a to-be-detected self-capacitor is defined between the self-capacitance detection branch and a system ground, the cancellation branch is configured to at least cancel an original reference value of the to-be-detected self-capacitor based on the determined control parameter, and the rear-end processing circuit is configured to at least perform differential processing for output signals of the self-capacitance detection branch and the cancellation branch to implement touch control detection.

In embodiments of the present application, a first constant signal is input to the cancellation branch, and a first excitation signal is input to a self-capacitance detection branch, where a rear-end processing circuit of the self-capacitance detection branch at least performs differential processing for an output signal of the cancellation branch and an output signal of the self-capacitance detection branch to obtain a first output signal; a sum of phase delays generated by the self-capacitance detection branch and the rear-end processing circuit of the self-capacitance detection branch in response to the first excitation signal is determined based on the first output signal; a second constant signal is input to the self-capacitance detection branch, and a second excitation signal is input to the cancellation branch, where the rear-end processing circuit of the self-capacitance detection branch at least performs differential processing for the output signal of the cancellation branch and the output signal of the self-capacitance detection branch to obtain a second output signal; a phase delay generated by the rear-end processing circuit in response to the second excitation signal is determined based on the second output signal; and the control parameter of the cancellation branch is determined based on the sum of phase delays and the phase delay generated by the rear-end processing circuit in response to the second excitation signal, such that an original reference value of a to-be-detected self-capacitor is at least canceled or reduced. This improves a variation amount or a variation rate of a capacitance of the self-capacitor, increases the accuracy of touch control detection, and further improves performance of self-coupling capacitance detection, such that user experience is enhanced.

BRIEF DESCRIPTION OF THE DRAWINGS

Some specific embodiments of the present application are described in detail hereinafter in an exemplary manner instead of a non-limitative manner with reference to the accompanying drawings. In the drawings, like reference numerals denote like or similar parts or elements. A person skilled in the art should understand that these drawings are drawn to scale. Among the drawings.

DETAILED DESCRIPTION

Nevertheless, it is not necessary to require that any technical solution according to the embodiments of the present application achieves all of the above technical effects.

For better understanding of the technical solutions according to the embodiments of the present application by a person skilled in the art, the technical solutions of the present application are clearly and completely described with reference to the accompanying drawings of the embodiments of the present application. Apparently, the described embodiments are only a part of the embodiments of the present application, rather than the entire embodiments. Based on the embodiments of the present application, all other embodiments derived by persons of ordinary skill in the art without any creative effort shall fall within the protection scope of the present application.

Specific implementations of the present application are further described hereinafter with reference to drawings of the embodiments of the present application.

Figure 1:
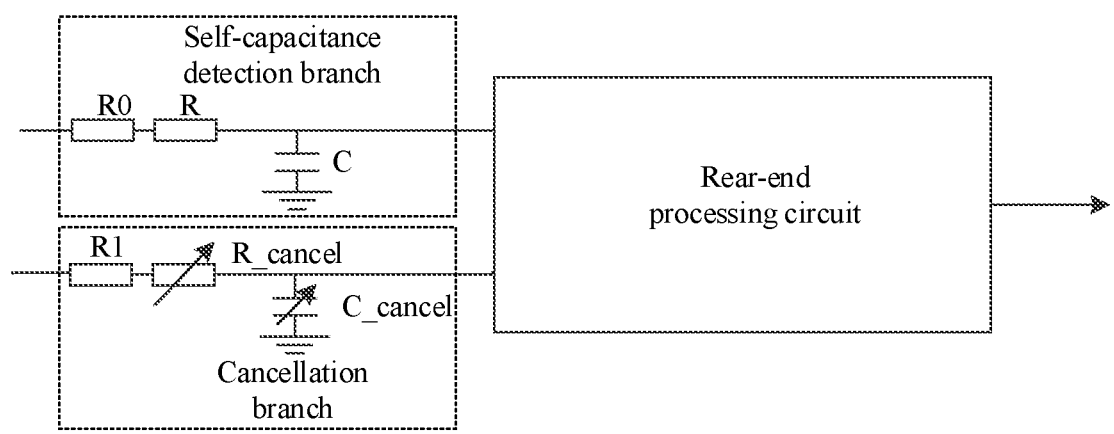
FIG. 1 is a schematic structural diagram of a touch control detection apparatus according to a first embodiment of the present application.
Figure 7:
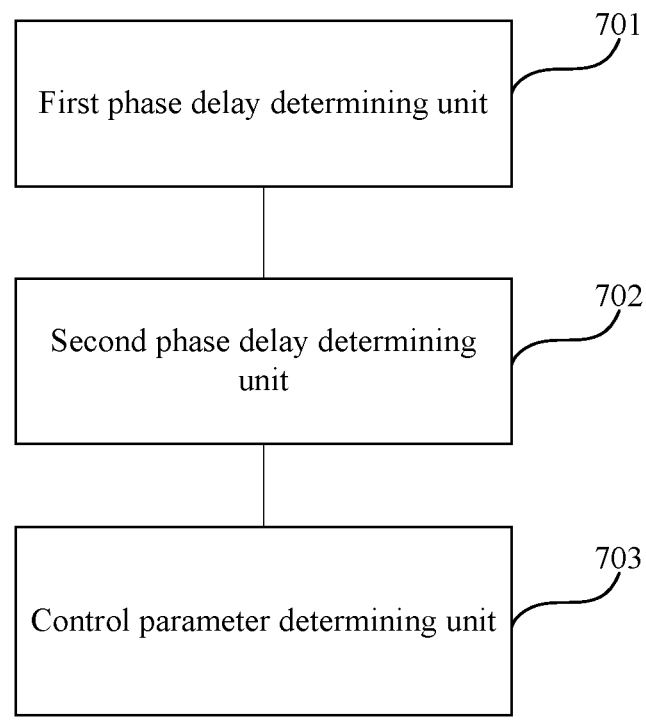
FIG. 7 is a schematic structural diagram of an apparatus for determining a control parameter of a cancellation branch according to a seventh embodiment of the present application.

FIG. 1 is a schematic structural diagram of a touch control detection apparatus according to a first embodiment of the present application. As illustrated in FIG. 1, the touch control detection apparatus specifically includes: a self-capacitance detection branch, a cancellation branch, a rear-end processing circuit, and the apparatus for determining a control parameter of a cancellation branch as illustrated in FIG. 7 hereinafter; where a to-be-detected self-capacitor is defined between the self-capacitance detection branch and a system ground, the cancellation branch is configured to cancel or reduce an original reference value of the to-be-detected self-capacitor based on the determined control parameter, and the rear-end processing circuit is configured to at least perform differential processing for output signals of the self-capacitance detection branch and the cancellation branch to implement touch control detection.

Specifically, in this embodiment, the self-capacitance detection branch includes: a resistor R0, a resistor R in a front-end RC network and a to-be-detected self-capacitor C, where the front RC network also includes the to-be-detected self-capacitor C. The resistor R0 may be specifically, for example, an output impedance of a touch control chip or another chip.

Specifically, in this embodiment, the cancellation branch includes a resistor R1, and a cancellation circuit (which is also marked as a cancel circuit) formed by an adjustable resistor R_cancel and an adjustable capacitor C_cancel. Values of the adjustable resistor R_cancel and the adjustable capacitor C_cancel may be adjusted according to the actual needs to cancel or reduce the resistor R in the front-end RC network in the self-capacitance detection branch and the original reference value of the to-be-detected self-capacitor. Herein, the cancellation or reduction may be understood in two ways. The adjustable resistor R_cancel cancels or reduces the resistor R in the front-end RC network, the adjustable capacitor C_cancel cancels or reduces the original reference value of the to-be-detected self-capacitor; and alternatively, the adjustable resistor R_cancel and the adjustable capacitor C_cancel are used as an entirety, and the resistor R in the front-end RC network and the original reference value of the to-be-detected self-capacitor are also used as an entirety. A cancellation or reduction relation is defined between these two entireties.

It should be noted that, in this embodiment, the original reference value of the to-be-detected self-capacitor may be, for example, a capacitance formed between the self-capacitance detection branch and the system ground during delivery of the touch control detection apparatus. Since the process or environment or human factors, capacitances formed between different self-capacitance detection branches and the system ground may be different, the values of the adjustable R_cancel and the adjustable capacitor C_cancel for the cancellation or reduction may also be different.

Specifically, in this embodiment, the rear-end processing circuit includes: an amplifier, a filter and an analog-to-digital converter (ADC). The amplifier is configured to perform differential processing for the output signal of the self-capacitance detection branch and the output signal of the cancellation branch, the filter is configured to perform filtering processing for signals upon the differential processing, and the analog-to-digital converter is configured to perform analog-to-digital conversion for signals upon the filtering.

Specifically, the amplifier may be a programmable gain amplifier (PGA), and the filter may be specifically an anti-alias filter (AAF). A sequence of signal processing of various circuits in the rear-end processing circuit is as follows: differential processing is performed first, and filtering processing is performed afterwards, and analog-to-digital conversion processing is performed finally. However, the sequence of signal processing herein is only an example, instead of being uniquely defined.

In this embodiment, the output signal of the self-capacitance detection branch and the cancellation branch are input to the rear-end processing circuit at least for differential processing, such that the cancellation branch cancels or reduces the original reference value of the to-be-detected self-capacitor in the self-capacitance detection branch.

In the embodiment as illustrated in FIG. 1, for formation of a symmetrical structure with the self-capacitance detection branch, a resistor R1 is arranged in the cancellation branch to correspond to the resistor R0 in the self-capacitance detection branch. However, it should be noted that since an adjustable resistor is present in the cancellation branch, the resistor R1 may not arranged in the cancellation branch in other embodiments.

With reference to the schematic diagram of the touch control detection apparatus as illustrated in FIG. 1, how to determine the control parameter of the cancellation branch according to the present application is exemplarily described in the embodiments hereinafter.

Figure 2:
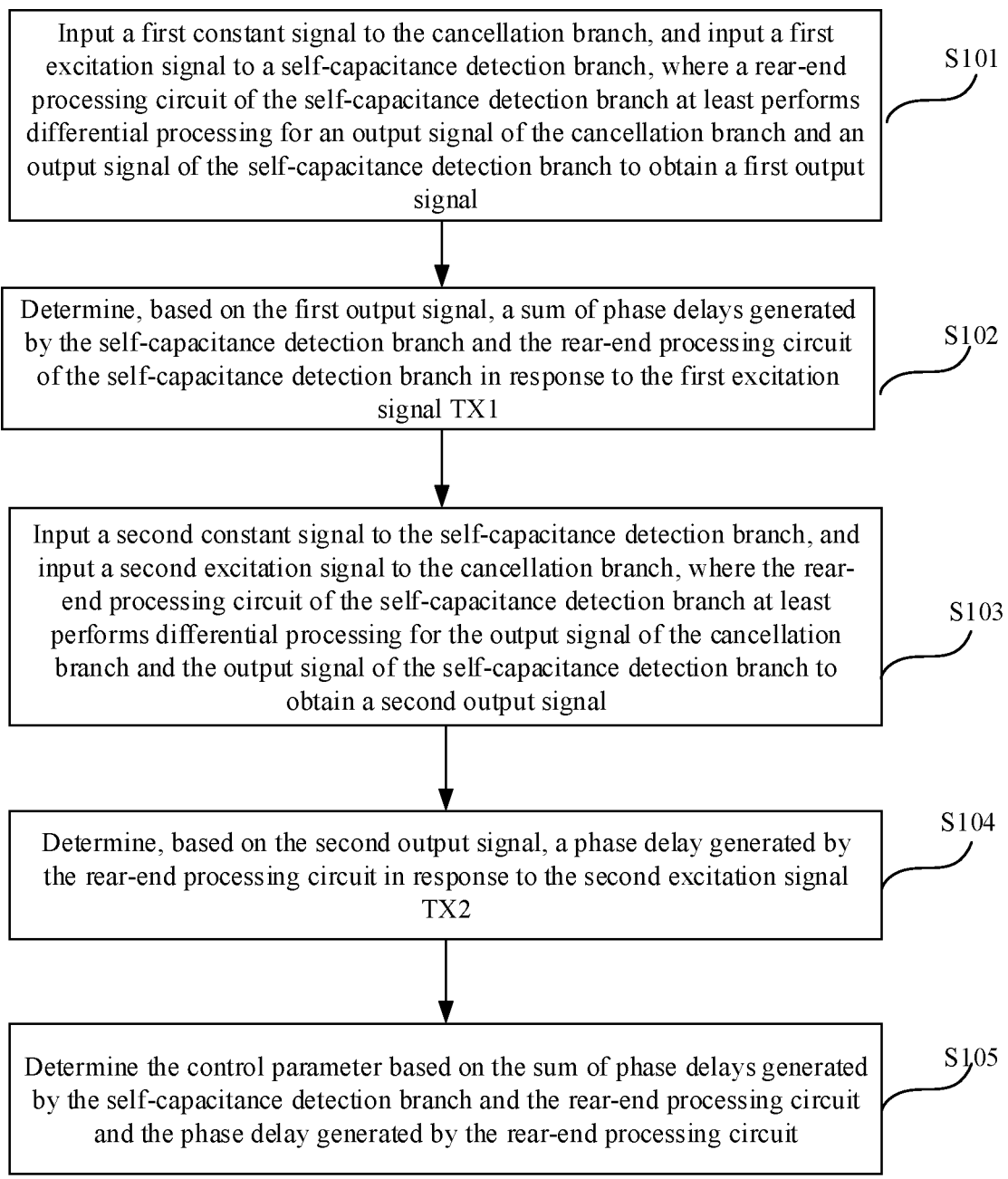
FIG. 2 is a schematic flowchart of a method for determining a control parameter of a cancellation branch according to a second embodiment of the present application.

FIG. 2 is a schematic flowchart of a method for determining a control parameter of a cancellation branch according to a second embodiment of the present application. With respect to any self-capacitance detection branch, as illustrated in FIG. 2, the method includes the following steps S101 to S105:

S101: A first constant signal is input to the cancellation branch, and a first excitation signal is input to a self-capacitance detection branch, where a rear-end processing circuit of the self-capacitance detection branch at least performs differential processing for an output signal of the cancellation branch and an output signal of the self-capacitance detection branch to obtain a first output signal.

In this embodiment, the first constant signal is a first direct current bias signal. For example, a value of the first direct current bias signal is equal to an average value Vcmi of excitation signals used for touch control detection. The first excitation signal TX1 has a predefined frequency and phase. For example, the frequency is ω and the phase is 0.

Figure 3:
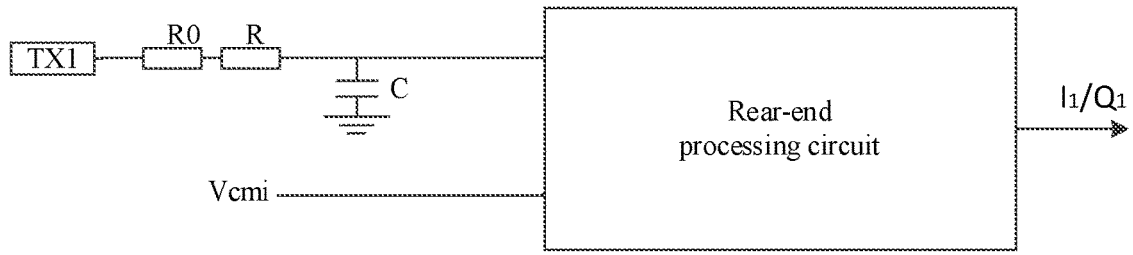
FIG. 3 is a schematic dynamic diagram of a circuit structure in FIG. 1 when step S101 is performed according to a third embodiment of the present application.

FIG. 3 is a schematic dynamic diagram of a circuit structure in FIG. 1 when step S101 is performed according to a third embodiment of the present application. As illustrated in FIG. 3, the first constant signal (for example, the average value Vcmi of the excitation signals) is input to the cancellation branch, and in the meantime, the first excitation signal TX1 having the frequency w and the starting phase 0 is input to the self-capacitance detection branch.

S102: A sum of phase delays generated by the self-capacitance detection branch and the rear-end processing circuit of the self-capacitance detection branch in response to the first excitation signal TX1 is obtained based on the first output signal.

In this embodiment, in step S102, when the sum of phase delays generated by the self-capacitance detection branch and the rear-end processing circuit of the self-capacitance detection branch in response to the first excitation signal is obtained based on the first output signal, the sum of the phase delay may be specifically obtained based on an amplitude and a phase of the first output signal.

Figure 4:
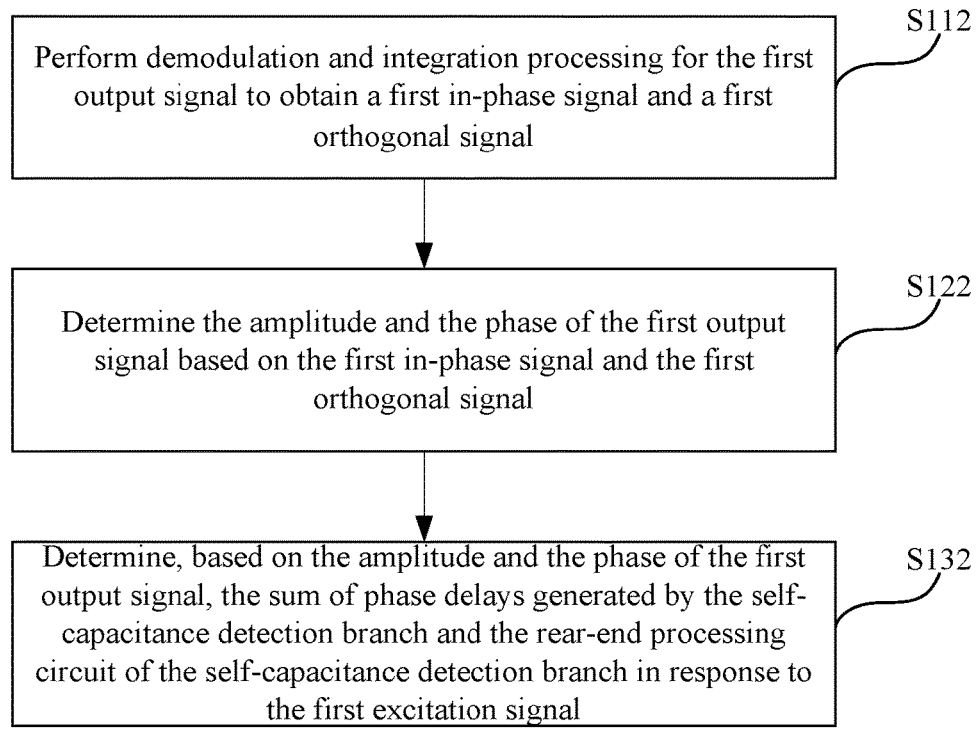
FIG. 4 is a schematic diagram of step S102 according to a fourth embodiment of the present application.

Correspondingly, step S102 may specifically include step S112 and step S132. Specifically, FIG. 4 is a schematic diagram of step S102 in the fourth embodiment of the present application.

S112: Demodulation and integration processing is performed for the first output signal to obtain a first in-phase signal and a first quadrature signal.

In this embodiment, referring to FIG. 3, the first excitation signal TX1 is processed by the self-capacitance detection branch and then, together with the first constant signal, is subjected to differential amplification by the amplifier, filtering processing by the filter, analog-to-digital conversion processing by the analog-to-digital converter in the rear-end processing circuit sequentially, such that the first output signal is obtained.

In this embodiment, the first output signal is obtained by processing by the rear-end processing circuit, and the first output signal is subjected to demodulation and integration to obtain two quadrature signals: a first in-phase signal (which is also marked as a first I signal, $I_1$) and a first quadrature signal (which is also marked as a first Q signal, $Q_1$).

S122: An amplitude and a phase of the first output signal are determined based on the first in-phase signal and the first quadrature signal.

S132: The sum of phase delays generated by the self-capacitance detection branch and the rear-end processing circuit of the self-capacitance detection branch in response to the first excitation signal is determined based on the amplitude and the phase of the first output signal.

In this embodiment, assume that the phase delay of the first excitation signal TX1 after traveling through the front-end RC network (that is, an RC network formed by R0+R, and C) in the self-capacitance detection direct current is $\varphi_1$, whereas the phase delay resulted from the processing by the amplifier and the filter in the processing circuit is $\Delta\varphi$, then upon the analog-to-digital conversion, the first in-phase signal $I_1$ and the first quadrature signal $Q_1$ may be obtained through demodulation and integration operations. In this case, the sum of phase delays $\varphi_1+\Delta\varphi$ may be determined based on the following formula (1):

$$\frac{Q_1}{I_1} = \tan(\varphi_1 + \Delta\varphi) \qquad (1)$$

S103: A second constant signal is input to the self-capacitance detection branch, and a second excitation signal is input to the cancellation branch, where the rear-end processing circuit of the self-capacitance detection branch at least performs differential processing for the output signal of the cancellation branch and the output signal of the self-capacitance detection branch to obtain a second output signal.

In this embodiment, the second constant signal is a second direct current bias signal. For example, a value of the second direct current bias signal is likewise equal to an average value of excitation signals used for touch control detection. In other words, the first constant signal and the second constant signal may be interchangeably multiplexed. The second excitation signal TX2 has a predefined frequency and starting phase. For example, the frequency is also w, and the starting phase is also 0.

In this embodiment, preferably, the frequency and starting phase of the first excitation signal TX1 are respectively the same as those of the second excitation signal TX2, such that the sum of phase delays and the phase delay in the above related steps are determined essentially based on the excitation signals having the same attribute. In this way, calculation workload in data processing is reduced.

In addition, for further reduction of the calculation workload in data processing or reduction of the complexity in data calculation, the starting phases of the first excitation signal TX1 and the second excitation signal TX2 are preferably 0.

Nevertheless, in other embodiment, the frequency and starting phase of the first excitation signal TX1 may also be different from those of the second excitation signal TX2.

Figure 5:
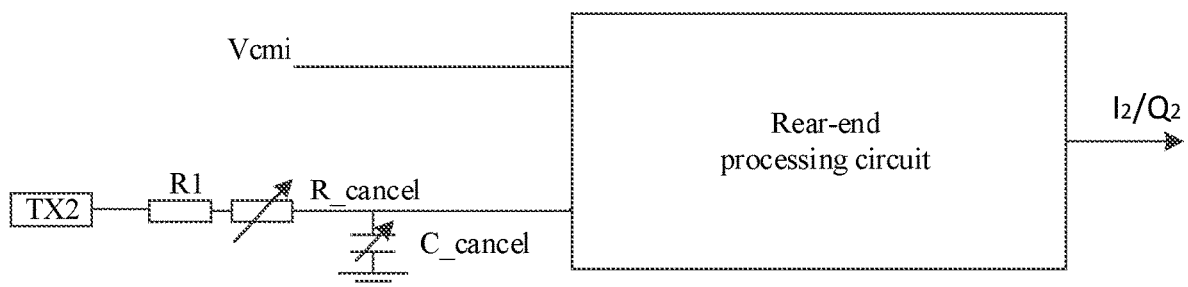
FIG. 5 is a schematic dynamic diagram of a circuit structure in FIG. 1 when step S103 is performed according to a fifth embodiment of the present application.

FIG. 5 is a schematic dynamic diagram of a circuit structure in FIG. 1 when step S103 is performed according to a fifth embodiment of the present application. As illustrated in FIG. 5, the second constant signal (for example, the average value Vcmi of the excitation signals) is input to the self-capacitance detection branch, and in the meantime, the second excitation signal TX2 having the frequency w and the starting phase 0 is input to the cancellation branch.

In addition, in step S103, for determination of the phase delay resulted by the rear-end processing circuit, the RC network in the cancellation branch is defined as an approximately pure impedance network or a pure impedance network, such that the phase delay resulted by the RC network in the cancellation branch is prevented. For example, the RC network may be defined as the approximately pure impedance network by adjusting the adjustable resistor and the adjustable capacitor in the RC network in the cancellation branch to minimum values.

S104: A phase delay generated by the rear-end processing circuit in response to the second excitation signal TX2 is obtained based on the second output signal.

In this embodiment, in step S104, the phase delay generated by the rear-end processing circuit in response to the second excitation signal TX2 may be specifically determined based on an amplitude and a phase of the second output signal.

Figure 6:
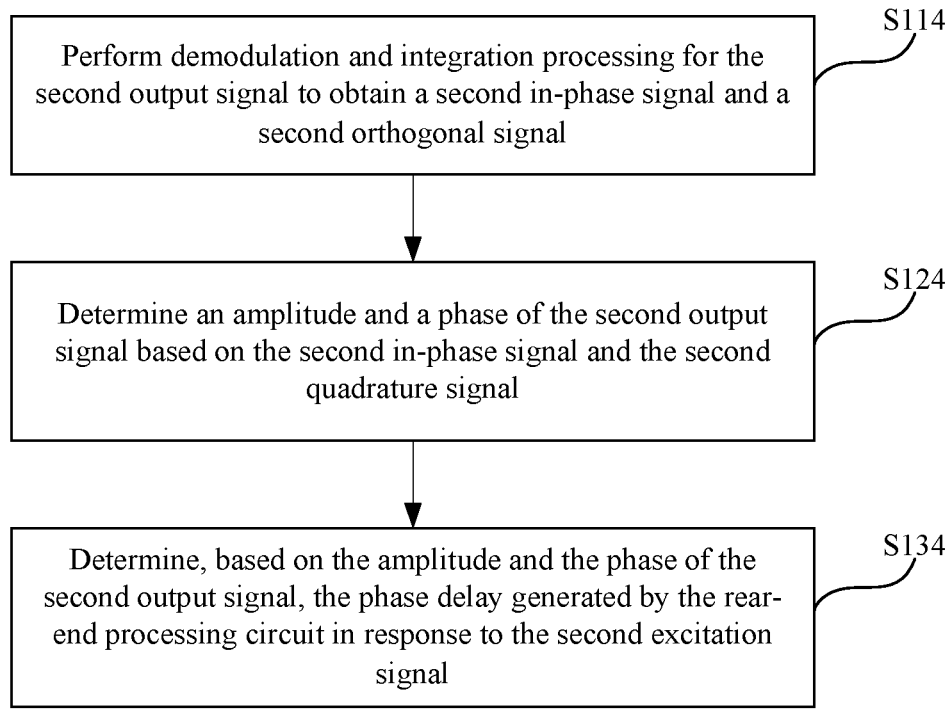
FIG. 6 is a schematic diagram of step S104 according to a sixth embodiment of the present application.

Specifically, in this embodiment, step S104 may specifically include step S114 and step S134. FIG. 6 is a schematic diagram of step S104 according to a sixth embodiment of the present application.

S114: Demodulation and integration processing is performed for the second output signal to obtain a second in-phase signal and a second quadrature signal.

In this embodiment, referring to FIG. 5, the second excitation signal TX2 is processed by the cancellation branch and then, together with the second constant signal, is subjected to differential amplification by the amplifier, filtering processing by the filter, analog-to-digital conversion processing by the analog-to-digital converter in the rear-end processing circuit sequentially, such that the second output signal is obtained.

It should be noted that since in this embodiment, the RC network in the cancellation branch is approximately a pure impedance network, from the perspective that whether a phase delay is caused, no phase delay is caused to the second excitation signal TX2, whereas only the rear-end processing circuit causes a phase delay for the second excitation signal TX2. Processing of the pure impedance network is the simplest based on the engineering practice. In practice, since R1, R_cancel and C_cancel are known, the phase and the amplitude of the second output signal may be calculated, and processing may still be performed. In the embodiment hereinafter, the simplest pure impedance network is still used as an example for description.

S124: An amplitude and a phase of the second output signal are determined based on the second in-phase signal and the second quadrature signal.

S134: The phase delay generated by the rear-end processing circuit in response to the second excitation signal is determined based on the amplitude and the phase of the second output signal.

In this embodiment, the second output signal is subjected to demodulation and integration to obtain two quadrature signals: a second in-phase signal (which is also marked as a second I signal, $I_2$) and a second quadrature signal (which is also marked as a second Q signal, $Q_2$). Impacts caused by the self-capacitance detection branch and the rear-end processing circuit to the amplitude and phase of the second excitation signal TX2 are reflected by the second in-phase signal and the second quadrature signal.

The adjustable resistor R_cancel and the adjustable capacitor C_cancel are adjusted to the minimum values, such that the RC network in the cancellation branch is approximately a pure impedance network. In this way, it is equivalently considered that the amplifier and the filter in the rear-end processing circuit results in the phase delay $\Delta\varphi$, and upon analog-to-digital conversion, the second in-phase signal $I_2$ and the second quadrature signal $Q_2$ may be obtained through demodulation and integration operations. In this way, the phase delay is determined based the following formula (2):

$$\frac{Q_2}{I_2} = \tan(\Delta\varphi) \qquad (2)$$

S105: The control parameter is obtained based on the sum of phase delays generated by the self-capacitance detection branch and the rear-end processing circuit and the phase delay generated by the rear-end processing circuit.

In this embodiment, as described above, the cancellation branch practically includes an adjustable resistor and an adjustable capacitor. Correspondingly, the control parameter of the cancellation branch includes a resistance of the adjustable resistor and a capacitance of the adjustable capacitor. By adjusting the resistance of the adjustable resistor and the capacitance of the adjustable capacitor, a resistance of a front-end RC network in the self-capacitance detection branch and an original reference value of a to-be-detected self-capacitor are cancelled or reduced.

In this embodiment, step S105 may specifically include steps S115 to S125:

S115: The phase delay generated by the self-capacitance detection branch in response to the first excitation signal is determined based on the sum of phase delays and the phase delay generated by the rear-end processing circuit in response to the second excitation signal.

S125: The control parameter of the cancellation branch is determined based on the phase delay generated by the self-capacitance detection branch in response to the first excitation signal.

Specifically, in this embodiment, the determining the control parameter of the cancellation branch in step S125 may include:

establishing an association relationship between a front-end RC network in the self-capacitance detection branch and an RC network in the cancellation branch based on the phase delay generated by the self-capacitance detection branch in response to the first excitation signal; and determining the control parameter of the cancellation branch based on the association relationship between the front-end RC network in the self-capacitance detection branch and the RC network in the cancellation branch.

Further, the control parameter of the cancellation branch includes a first control parameter and a second control parameter, and correspondingly, the determining the control parameter of the cancellation branch based on an association relationship between the front-end RC network in the self-capacitance detection branch and the RC network in the cancellation branch includes: determining the second control parameter of the cancellation branch based on the association relationship between the front-end RC network in the self-capacitance detection branch and the RC network in the cancellation branch, and a predefined first control parameter of the cancellation branch.

Optionally, in any embodiment of the present application, the first control parameter in the cancellation branch is predefined in a designated value range, where the designated value range is determined based on an empirical value of the original reference value of the to-be-detected self-capacitor. For example, the empirical value is determined by statistical collection of the original reference values of the touch control apparatus under different processes and different environments.

With reference to the above formulae (1) and (2), step S105 is further exemplarily interpreted.

Based on the above formulae (1) and (2), the following formula (3) may be obtained:

$$\tan\varphi_1 = \tan(\varphi_1 + \Delta\varphi - \Delta\varphi) = \frac{\tan(\varphi_1 + \Delta\varphi) - \tan(\Delta\varphi)}{1 + \tan(\varphi_1 + \Delta\varphi)\tan(\Delta\varphi)} = \frac{Q_1 I_2 - Q_2 I_1}{Q_1 Q_2 + I_1 I_2} \quad (3)$$

As seen from the above formula (3), the phase delay $\varphi_1$ resulted from the front-end RC network in the self-capacitance detection branch may be determined based on the sum of phase delays $\varphi_1 + \Delta\varphi$ and the phase delay $\Delta\varphi$.

In addition, the phase delay $\varphi_1$ resulted from the front-end RC network in the self-capacitance detection branch satisfies the following formula (4):

$$\tan \varphi_1 = -\omega(R+R_0)C \quad (4)$$

Based on the above formulae (3) and (4), the following formula (5) may be obtained:

$$C(R+R_0) = \frac{Q_2 I_1 - Q_1 I_2}{(Q_1 Q_2 + I_1 I_2)\omega} = const = (R1 + R\_cancel)C\_cancel \quad (5)$$

Referring to the above formula (5), the first I signal $I_1$, the first Q signal $Q_1$, the second I signal $I_2$ and the second Q signal $Q_2$ are obtained through the above steps, and the frequency $\omega$ is also known. In this case, a constant may be calculated.

With respect to the self-capacitance detection branch and the cancellation branch, a product of the corresponding resistor and capacitor, that is, an RC parameter, is equal to the above constant. That is, the constant is obtained through calculation based on the first I signal $I_1$, the first Q signal $Q_1$, the second I signal $I_2$, the second Q signal $Q_2$, and the frequency $\omega$, and an association relationship between the front-end RC network in the self-capacitance detection branch and the RC network in the cancellation branch is established based on the constant, such that the values of the adjustable resistor and the adjustable capacitor that may be used to cancel or reduce the resistor R and the original reference value of the to-be-detected self-capacitor.

In the above formula (5), since the resistances of the resistor R and the resistor R0 are known, the resistance of the resistor R1 is also known, and the adjustable grades of the adjustable resistor R_cancel and the adjustable capacitor C_cancel are known, the resistance of the adjustable resistor R_cancel and the capacitance of the adjustable capacitor C_cancel only need to be adjusted, as long as a product C(R+R_0) of a sum of the resistor R and the resistor R0 and the original reference value of the to-be-detected self-capacitor is equal to a product (R1+R_cancel)C_cancel of a sum of the resistor R1 and the adjustable resistor R_cancel and the capacitance of the adjustable capacitor C_cancel.

Further, in practice, a constant may be obtained through calculation in the above steps, then a capacitance of the adjustable capacitor C_cancel may be defined based on grade selection, and finally a capacitance that is closest to a theoretical value of the adjustable resistor R_cancel calculated based on the above formula (5), such that the control parameter of the cancellation branch is determined.

As described above, since in practice, the original reference value of the to-be-detected self-capacitor may be different due to process or environment but may substantially be in a predictable value range, during selection of the adjustable capacitor C_cancel, considering symmetry between the adjustable capacitor C_cancel and the to-be-detected self-capacitor in terms of circuitry, selection may be made with reference to the value range, such that data processing may be reduced. In this way, the performance of self-coupling capacitance detection is further enhanced while the original reference value of the to-be-detected self-capacitor is at least cancelled or reduced.

Further, the values of the adjustable resistor R_cancel and the adjustable capacitor C_cancel may also be determined by table lookup. Specifically, for example, traversal selection may be carried out for the adjustable resistor R_cancel and the adjustable capacitor C_cancel, concurrently the value of (R1+R_cancel)C_cancel is calculated, and these values are stored in a chip in the form of a table. After the constant is obtained through calculation based on the above formula (5), a value of (R1+R_cancel)C_cancel which, together with the constant, is most approximate to or absolutely equal to the values of the corresponding adjustable resistor R_cancel and adjustable capacitor C_cancel is selected from the stored table, such that the performance of self-coupling capacitance detection is further enhanced while the original reference value of the to-be-detected self-capacitor is at least cancelled or reduced.

In other embodiments, a time sequence among steps S101 to S104 is only exemplary. In other embodiments, the time sequence may be flexibly adjusted. For example, step S103 and step S104 are performed firstly, and then step S101 and step S102 are performed.

FIG. 7 is a schematic structural diagram of an apparatus for determining a control parameter of a cancellation branch according to a seventh embodiment of the present application. As illustrated in FIG. 7, the apparatus includes: a first phase delay determining unit 701, a second phase delay determining unit 702, and a control parameter determining unit 703; where when a first constant signal is input to the cancellation branch and a first excitation signal is input to a self-capacitance detection branch, a rear-end processing circuit of the self-capacitance detection branch at least performs differential processing for an output signal of the cancellation branch and an output signal of the self-capacitance detection branch to obtain a first output signal, the first phase delay determining unit 701 is configured to determine, based on the first output signal, a sum of phase delays generated by the self-capacitance detection branch and the rear-end processing circuit of the self-capacitance detection branch in response to the first excitation signal;

when a second constant signal is input to the self-capacitance detection branch and a second excitation signal is input to the cancellation branch, the rear-end processing circuit of the self-capacitance detection branch at least performs differential processing for the output signal of the cancellation branch and the output signal of the self-capacitance detection branch to obtain a second output signal, and the second delay determining unit 702 is configured to determine, based on the second output signal, a phase delay generated by the rear-end processing circuit in response to the second excitation signal; and the control parameter determining unit 703 is configured to determine the control parameter of the cancellation branch based on the sum of phase delays and the phase delay generated by the rear-end processing circuit in response to the second excitation signal.

In the above embodiment, with the technical solution according to the above embodiment, the original reference value of the to-be-detected self-capacitor is cancelled or reduced, and the variation rate of the self-capacitor is improved. In addition, due to the improvement of the variation rate of the capacitor, the rear-end processing circuit is prevented from saturation, a dynamic range of detection signals is further increased, and signal-to-noise ratio is improved.

The above described apparatus embodiments are merely for illustration purpose only. The modules which are described as separate components may be physically separated or may be not physically separated, and the components which are illustrated as modules may be or may not be physical modules, that is, the components may be located in the same position or may be distributed into a plurality of network modules. A part or all of the modules may be selected according to the actual needs to achieve the objectives of the technical solutions of the embodiments. Persons of ordinary skill in the art may understand and implement the present application without paying any creative effort.

According to the above embodiments of the present application, a person skilled in the art may clearly understand that the embodiments of the present application may be implemented by means of hardware or by means of software plus a necessary general hardware platform. Based on such understanding, portions of the technical solutions of the present application that essentially contribute to the related art may be embodied in the form of a software product, the computer software product may be stored in a computer readable storage medium. The computer-readable storage medium includes any mechanism for storing or transferring information in a computer readable form. For example, the computer-readable medium includes a read-only memory (ROM), a random access memory (RAM), a disk storage medium, an optical storage medium, a flash storage medium, electricity, light, sound and other forms of propagation signals (for example, a carrier, an infrared signal, a digital signal and the like) and the like. The computer software product includes several instructions for instructing a computer device (which may be a personal computer, a server or a network device) to perform all the embodiments or some parts of the embodiments.

Finally, it should be noted that the above embodiments are merely intended to describe the technical solutions according to the embodiments of the present application, instead of limiting the present application. Although the present application is described in detail with reference to the above embodiments, persons of ordinary skill in the art should understand that various modifications may be made to the technical solutions described in the above embodiments or equivalent replacements may be made to some technical features thereof, without departing from the spirit and scope of the technical solutions of the embodiments of the present application.

A person skilled in the art shall understand that the embodiments of the present application may be described to illustrate methods, apparatuses (devices), or computer program products. Therefore, hardware embodiments, software embodiments, or hardware-plus-software embodiments may be used to illustrate the embodiments of the present application. In addition, the embodiments of the present application may further employ a computer program product which may be implemented by at least one non-transitory computer-readable storage medium with an executable program code stored thereon. The non-transitory computer-readable storage medium includes, but not limited to, a disk memory, a CD-ROM, and an optical memory.

The embodiments of the present application are described based on the flowcharts and/or block diagrams of the method, apparatus (device), and computer program product according to the embodiments of the present application. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams.

These computer program instructions may also be stored a non-transitory computer-readable memory capable of causing a computer or other programmable data processing devices to work in a specific mode, such that the instructions stored on the non-transitory computer-readable memory implement a product including an instruction apparatus, where the instruction apparatus implements specific functions in at least one process in the flowcharts and/or at least one block in the block diagrams.

These computer program instructions may also be stored on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

What is claimed is:

1. A method for determining a control parameter of an offset branch of an electric circuit, comprising:
   inputting a first constant signal to the offset branch, and inputting a first excitation signal to a self-capacitance detection branch, wherein a rear-end processing circuit of the self-capacitance detection branch at least performs differential processing for an output signal of the offset branch and an output signal of the self-capacitance detection branch to obtain a first output signal;
   obtaining, based on the first output signal, a sum of phase delays generated by the self-capacitance detection branch and the rear-end processing circuit of the self-capacitance detection branch in response to the first excitation signal;
   inputting a second constant signal to the self-capacitance detection branch, and inputting a second excitation signal to the offset branch, wherein the rear-end processing circuit of the self-capacitance detection branch at least performs differential processing for an output signal of the offset branch and the output signal of the self-capacitance detection branch to obtain a second output signal;

obtaining, based on the second output signal, a phase delay generated by the rear-end processing circuit in response to the second excitation signal; and obtaining the control parameter of the offset branch based on the sum of phase delays and the phase delay generated by the rear-end processing circuit in response to the second excitation signal, wherein the control parameter of the offset branch is resistor and capacitor values.

2. The method according to claim 1, wherein the first constant signal is a first direct current bias signal, and the second constant signal is a second direct current bias signal.

3. The method according to claim 1, wherein the first constant signal is a first direct current bias signal, or the second constant signal is a second direct current bias signal.

4. The method according to claim 1, wherein the first excitation signal and the second excitation signal have the same frequency and starting phase.

5. The method according to claim 1, wherein the control parameter of the offset branch comprises a resistance of an adjustable resistor and a capacitance of an adjustable capacitor; wherein the adjustable resistor and the adjustable capacitor are configured to cancel or reduce a resistance of a front-end RC network in the self-capacitance detection branch and an original reference value of a to-be-detected self-capacitor.

6. The method according to claim 1, wherein an RC network in the offset branch is configured as a pure impedance network or an approximately pure impedance network during determining the phase delay generated by the rear-end processing circuit in response to the second excitation signal.

7. The method according to claim 1, wherein the determining, based on the first output signal, a sum of phase delays generated by the self-capacitance detection branch and the rear-end processing circuit of the self-capacitance detection branch in response to the first excitation signal comprises:

determining, based on an amplitude and a phase of the first output signal, the sum of phase delays generated by the self-capacitance detection branch and the rear-end processing circuit of the self-capacitance detection branch in response to the first excitation signal.

8. The method according to claim 7, wherein the determining, based on the first output signal, a sum of phase delays generated by the self-capacitance detection branch and the rear-end processing circuit of the self-capacitance detection branch in response to the first excitation signal further comprises:

performing demodulation and integration processing for the first output signal to obtain a first in-phase signal and a first quadrature signal; and determining the amplitude and the phase of the first output signal based on the first in-phase signal and the first quadrature signal.

9. The method according to claim 1, wherein the determining, based on the second output signal, a phase delay generated by the rear-end processing circuit in response to the second excitation signal comprises:

determining, based on an amplitude and a phase of the second output signal, the phase delay generated by the rear-end processing circuit in response to the second excitation signal.

10. The method according to claim 9, wherein the determining, based on the second output signal, a phase delay generated by the rear-end processing circuit in response to the second excitation signal further comprises:

performing demodulation and integration processing for the second output signal to obtain a second in-phase signal and a second quadrature signal; and determining the amplitude and the phase of the second output signal based on the second in-phase signal and the second quadrature signal.

11. The method according to claim 1, wherein the determining the control parameter of the offset branch based on the sum of phase delays and the phase delay generated by the rear-end processing circuit in response to the second excitation signal comprises:

determining, based on the sum of phase delays and the phase delay generated by the rear-end processing circuit in response to the second excitation signal, the phase delay generated by the self-capacitance detection branch in response to the first excitation signal; and determining the control parameter of the offset branch based on the phase delay generated by the self-capacitance detection branch in response to the first excitation signal.

12. The method according to claim 11, wherein the determining the control parameter of the offset branch based on the phase delay generated by the self-capacitance detection branch in response to the first excitation signal comprises:

establishing an association relationship between a front-end RC network in the self-capacitance detection branch and an RC network in the offset branch based on the phase delay generated by the self-capacitance detection branch in response to the first excitation signal; and determining the control parameter of the offset branch based on the association relationship between the front-end RC network in the self-capacitance detection branch and the RC network in the offset branch.

13. The method according to claim 12, wherein the control parameter of the offset branch comprises a first control parameter and a second control parameter, and correspondingly, the determining the control parameter of the offset branch based on an association relationship between the front-end RC network in the self-capacitance detection branch and the RC network in the offset branch comprises:

determining the second control parameter of the offset branch based on the association relationship between the front-end RC network in the self-capacitance detection branch and the RC network in the offset branch, and a predefined first control parameter of the offset branch.

14. The method according to claim 1, wherein the rear-end processing circuit comprises at least one of: an amplifier, a filter and an analog-to-digital converter; wherein the amplifier is configured to perform differential processing for the output signal of the self-capacitance detection branch and the output signal of the offset branch, the filter is configured to perform filtering processing for signals upon the differential processing, and the analog-to-digital converter is configured to perform analog-to-digital conversion for signals upon the filtering.

15. An apparatus for determining a control parameter of an offset branch of an electric circuit, comprising:

a first phase delay determining unit;

a second phase delay determining unit; and a control parameter determining unit;
wherein,
when a first constant signal is input to the offset branch and a first excitation signal is input to a self-capacitance detection branch, a rear-end processing circuit of the self-capacitance detection branch at least performs differential processing for an output signal of the offset branch and an output signal of the self-capacitance detection branch to obtain a first output signal, the first phase delay determining unit is configured to determine, based on the first output signal, a sum of phase delays generated by the self-capacitance detection branch and the rear-end processing circuit of the self-capacitance detection branch in response to the first excitation signal;
when a second constant signal is input to the self-capacitance detection branch and a second excitation signal is input to the offset branch, the rear-end processing circuit of the self-capacitance detection branch at least performs differential processing for the output signal of the offset branch and the output signal of the self-capacitance detection branch to obtain a second output signal, and the second delay determining unit is configured to determine, based on the second output signal, a phase delay generated by the rear-end processing circuit in response to the second excitation signal; and
the control parameter determining unit is configured to determine the control parameter of the offset branch based on the sum of phase delays and the phase delay generated by the rear-end processing circuit in response to the second excitation signal, wherein the control parameter of the offset branch is resistor and capacitor values.

16. The apparatus according to claim 15, wherein the first constant signal is a first direct current bias signal, and the second constant signal is a second direct current bias signal.

17. The apparatus according to claim 15, wherein the first constant signal is a first direct current bias signal, or the second constant signal is a second direct current bias signal.

18. The apparatus according to claim 15, wherein the first excitation signal and the second excitation signal have the same frequency and starting phase.

19. The apparatus according to claim 15, wherein the control parameter of the offset branch comprises a resistance of an adjustable resistor and a capacitance of an adjustable capacitor; wherein the adjustable resistor and the adjustable capacitor are configured to cancel or reduce a resistance of a front-end RC network in the self-capacitance detection branch and an original reference value of a to-be-detected self-capacitor.

20. A touch control detection apparatus, comprising:
a self-capacitance detection branch;
an offset branch;
a rear-end processing circuit, and
the apparatus for determining a control parameter of an offset branch as defined in claim 15;
wherein a to-be-detected self-capacitor is formed between the self-capacitance detection branch and a system ground, the offset branch is configured to at least cancel an original reference value of the to-be-detected self-capacitor based on the control parameter that is determined, and the rear-end processing circuit is configured to at least perform differential processing to output signals of the self-capacitance detection branch and the offset branch to implement touch control detection.

* * * * *